United States Patent
Sakamoto et al.

(10) Patent No.: US 11,987,445 B2
(45) Date of Patent: May 21, 2024

(54) LID OPENING-AND-CLOSING DEVICE

(71) Applicant: Murata Machinery, Ltd., Kyoto (JP)

(72) Inventors: Akifumi Sakamoto, Inuyama (JP);
Ryota Yamazaki, Inuyama (JP);
Ryoma Nunome, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 419 days.

(21) Appl. No.: 17/432,522

(22) PCT Filed: Jan. 20, 2020

(86) PCT No.: PCT/JP2020/001662
§ 371 (c)(1),
(2) Date: Aug. 20, 2021

(87) PCT Pub. No.: WO2020/170672
PCT Pub. Date: Aug. 27, 2020

(65) Prior Publication Data
US 2022/0135326 A1    May 5, 2022

(30) Foreign Application Priority Data
Feb. 22, 2019   (JP) .................................. 2019-030400

(51) Int. Cl.
*B65G 1/10*  (2006.01)
*G03F 1/66*  (2012.01)
*H01L 21/673*  (2006.01)

(52) U.S. Cl.
CPC .................. *B65G 1/10* (2013.01); *G03F 1/66* (2013.01); *H01L 21/67359* (2013.01)

(58) Field of Classification Search
CPC ................ B65G 1/10; H01L 21/67386; H01L 21/67359; H01L 21/67353;
(Continued)

(56) References Cited

U.S. PATENT DOCUMENTS 4,422,547 A * 12/1983 Abe .................... G03F 7/70741
                                                               312/61
5,314,068 A   5/1994 Nakazato et al.
(Continued)

FOREIGN PATENT DOCUMENTS

JP     H05-175321 A    7/1993
JP     3089590 B2      9/2000
(Continued)

OTHER PUBLICATIONS

Extended European Search Report dated Oct. 6, 2022, of counterpart European Patent Application No. 20758667.8.

*Primary Examiner* — Glenn F Myers
(74) *Attorney, Agent, or Firm* — DLA Piper LLP (US)

(57) ABSTRACT

A lid opening-and-closing device that opens and closes an upper lid of a container, the container including: a container body; the upper lid; a locking mechanism that locks the upper lid onto the container body when the upper lid is mounted on the container body; and a strip provided to the upper lid, the device including: a placement platform on which the container is placed; a guide provided on both sides above the placement platform and comes into contact with a lower face of the strip to rotate the strip upward to an extent exceeding the predetermined value with respect to the container body when the container is inserted in the horizontal direction to a specified position of the placement platform; and a raising/lowering mechanism that moves the container body and the upper lid for which locking by the locking mechanism has been released, relatively in an up-and-down direction.

7 Claims, 12 Drawing Sheets

(58) Field of Classification Search
CPC ......... H01L 21/67373; H01L 21/67763; H01L 21/67775; H01L 21/67772; G03F 1/66; G03F 7/70741; Y10S 414/14; Y10S 414/135; B65D 55/12; B65D 81/05
See application file for complete search history.

(56) References Cited

U.S. PATENT DOCUMENTS

| | | | |
|---|---|---|---|
| 2002/0021435 A1 | 2/2002 | Yamada | |
| 2005/0072358 A1* | 4/2005 | Katsuoka | C25D 17/001 118/719 |
| 2012/0180704 A1* | 7/2012 | Taylor | A47F 5/0081 108/20 |
| 2015/0217339 A1* | 8/2015 | Sakashita | H01L 21/02041 134/115 R |

FOREIGN PATENT DOCUMENTS

| | | |
|---|---|---|
| JP | 2002-009133 A | 1/2002 |
| JP | 2007-141924 A | 6/2007 |
| JP | 2015-093696 A | 5/2015 |

* cited by examiner

LID OPENING-AND-CLOSING DEVICE

TECHNICAL FIELD

This disclosure relates to a lid opening-and-closing device.

BACKGROUND

In a semiconductor manufacturing factory, for example, an article such as a reticle is conveyed to a storage device, a semiconductor manufacturing device or the like while being accommodated in a container such as a reticle pod, and the reticle, for example, is retrieved from the container in the storage device or the like. The container includes a container body on which an article is placed and an upper lid, and also includes a locking mechanism that locks the upper lid onto the container body when the upper lid is mounted on the container body. The locking mechanism has a configuration in which locking is released when having rotated a strip, which is provided to the upper lid and extends in the horizontal direction, upward to an extent exceeding a predetermined value with respect to the container body. To retrieve an accommodated article from a container including such a locking mechanism, for a storage device, for example, a lid opening-and-closing device that releases the above-described locking mechanism and opens and closes an upper lid from the container body by has been proposed (see Japanese Patent No. 3089590, for example).

The lid opening-and-closing device described in JP '590 includes an actuator that releases locking by the locking mechanism, and has a configuration in which the actuator is driven to release the locking mechanism for the container and then raise the upper lid from the container body. The lid opening-and-closing device including the actuator that releases locking by the locking mechanism has a problem of increasing size of the device due to inclusion of the actuator.

It could therefore be helpful to provide a lid opening-and-closing device that can suppress upsizing of the device.

SUMMARY

Our lid opening-and-closing device is a lid opening-and-closing device that opens and closes an upper lid of a container, the container including: a container body; the upper lid; a locking mechanism that locks the upper lid onto the container body when the upper lid is mounted on the container body; and a strip that is provided to the upper lid, extends in a horizontal direction, and releases locking by the locking mechanism when being rotated upward to an extent exceeding a predetermined value with respect to the container body. The lid opening-and-closing device includes: a placement platform on which the container is placed; a guider that is provided on both sides above the placement platform and comes into contact with a lower face of the strip to rotate the strip upward to an extent exceeding the predetermined value with respect to the container body when the container is inserted in the horizontal direction to a specified position of the placement platform; and a raising/lowering mechanism that moves the container body and the upper lid for which locking by the locking mechanism has been released, relatively in an up-and-down direction.

The lid opening-and-closing device may include an upper guider that comes into contact with an upper face of each of side portions of the upper lid, the side portions being opposed to each other above the strip, when the container is inserted in the horizontal direction to the specified position of the placement platform. A groove may be formed by an upper face of the guider and a lower face of the upper guider, and the side portions of the upper lid and the strip may be movable along the groove. The groove may be provided in the raising/lowering mechanism. The groove may hold the side portions of the upper lid and the strip, and the raising/lowering mechanism may include a raising/lowering driver that raises and lowers the guider and the upper guider held by the groove with respect to the container body. On a tip of the placement platform on an inlet side for insertion of the container, a slope may be provided. On a tip of the guider on an inlet side, an inclined surface or a curved surface may be provided.

With the lid opening-and-closing device described above, when the container is inserted in the horizontal direction to the specified position of the placement platform, the guider comes into contact with the lower face of the strip, and rotates the strip upward to an extent exceeding the predetermined value with respect to the container body to release the locking mechanism. In other words, because the locking mechanism of the container is released only by inserting the container to the specified position of the placement platform in the horizontal direction, an actuator to release the locking mechanism is not necessary and upsizing of the device can be suppressed. Furthermore, because a movable component such as an actuator is not provided, generation of particles can be reduced.

In the configuration in which the upper guider is provided that comes into contact with the upper face of each of the side portions of the upper lid, the side portions being opposed to each other above the strip, when the container is inserted in the horizontal direction to the specified position of the placement platform, the upper lid is prevented from moving upward by the upper guider when the strip is rotated upward by the guider. Thus, the strip can be reliably rotated with respect to the container body. In the configuration in which the groove is formed by the upper face of the guider and the lower face of the upper guider, and the side portions of the upper lid and the strip are movable along the groove, the strip can be reliably rotated by fitting the side portion of the upper lid and the strip in the groove. In the configuration in which the groove is included in the raising/lowering mechanism, by raising and lowering the groove by the raising/lowering mechanism, the side portion of the upper lid and the strip (i.e., the upper lid) fitted in the groove can be easily raised and lowered. In the configuration in which the groove holds the side portion of the upper lid and the strip and the raising/lowering mechanism includes the raising/lowering driver that raises and lower the guider and the upper guider held by the groove with respect to the container body, the groove also serves as a holder for the upper lid, which eliminates the need for an additional holder to hold the upper lid and can avoid increase in the number of components. Furthermore, the upper lid for which locking by the locking mechanism has been released can be easily separated from the container body. In the configuration in which the slope is provided on the tip of the placement platform on the inlet side for insertion of the container, the bottom of the container is guided by the slope when the container is inserted, and thus the container can be positioned at an appropriate height. In the configuration in which the inclined surface or the curved surface is provided on the tip of the guider on the inlet side, the strip comes into contact with the inclined surface or the curved surface when the container is inserted, and thus the strip can be appropriately guided onto the guider.

DESCRIPTION OF REFERENCE SIGNS

Figure 1:
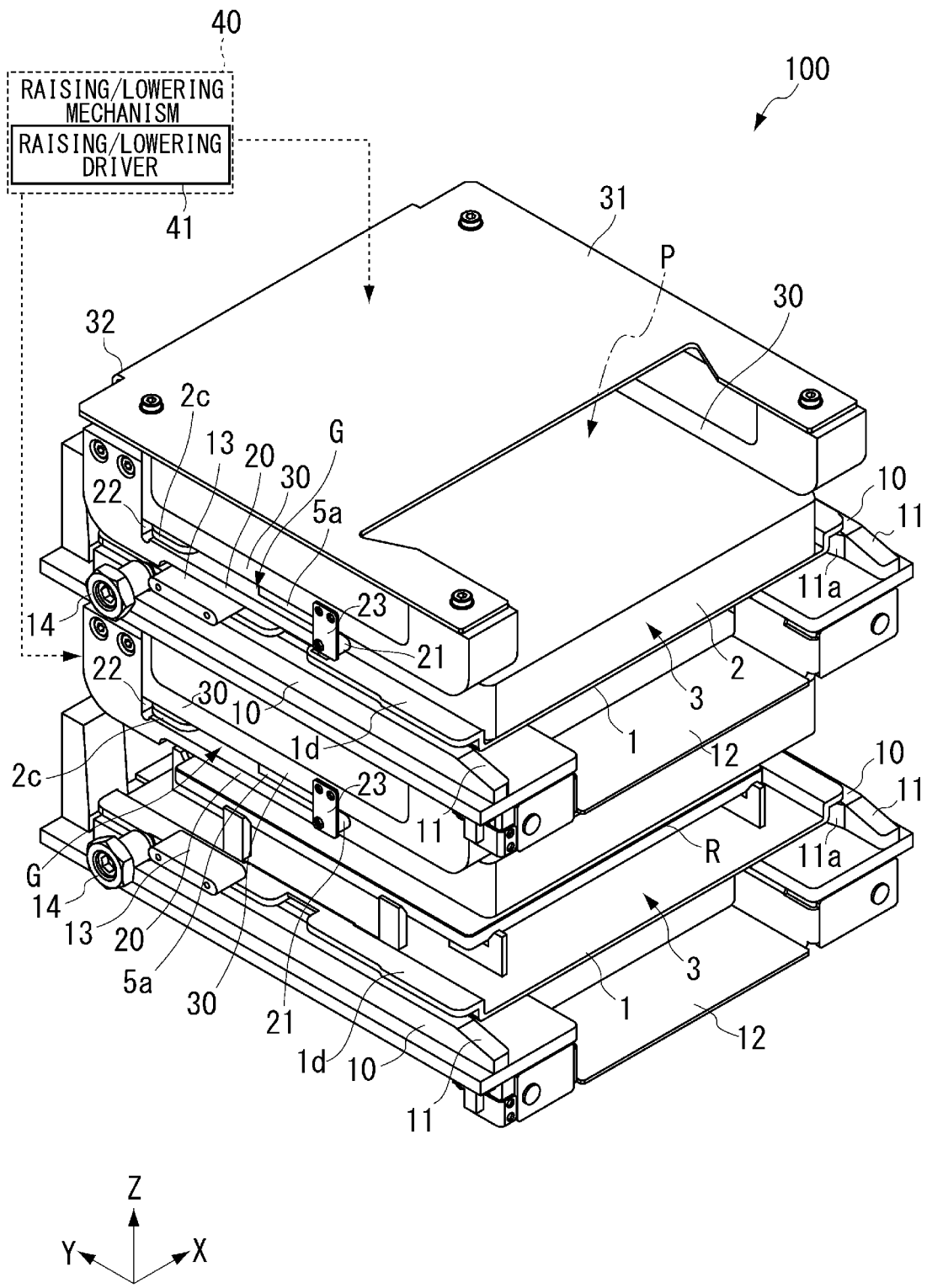
FIG. 1 is a perspective view illustrating one example of a lid opening-and-closing device.

G groove
L predetermined distance
P specified position
R reticle
1 container body
2 upper lid
2a side portion
2c protruding piece
3 container
4 locking mechanism
5 locking member
5a strip
5c claw
10 placement platform
11 slope
20 lower guider (guider)
20a upper face
21 curved surface
30 upper guider
30a lower face
40 raising/lowering mechanism
41 raising/lowering driver
50 shutter
52 magnet
53 stuck member
60 shutter drive
61 driver
62 link member
71 side wall
72 slit
100, 200 lid opening-and-closing device

DETAILED DESCRIPTION

Examples will now be described with reference to the drawings. It should be noted that our devices are not limited to the examples described below. In the drawings, to describe the examples, the scale is changed to be expressed as appropriate by, for example, illustrating a part in an enlarged or emphasized manner. In each drawing, directions in the drawing are illustrated with the XYZ-coordinate system. In this XYZ-coordinate system, the up-and-down direction (vertical direction) is defined as the Z direction, and horizontal directions are defined as the X direction, and the Y direction. The Y direction is one direction in the horizontal directions, and is a direction in which a container described later is inserted. The X direction is a direction orthogonal to the Y direction. In each direction of the X, Y, Z directions, as appropriate, the orientation indicated by each arrow is expressed as a +direction (e.g., +X direction), and the direction opposite to the orientation indicated by the arrow is expressed as a − direction (e.g., −X direction).

First Example

Figure 2:
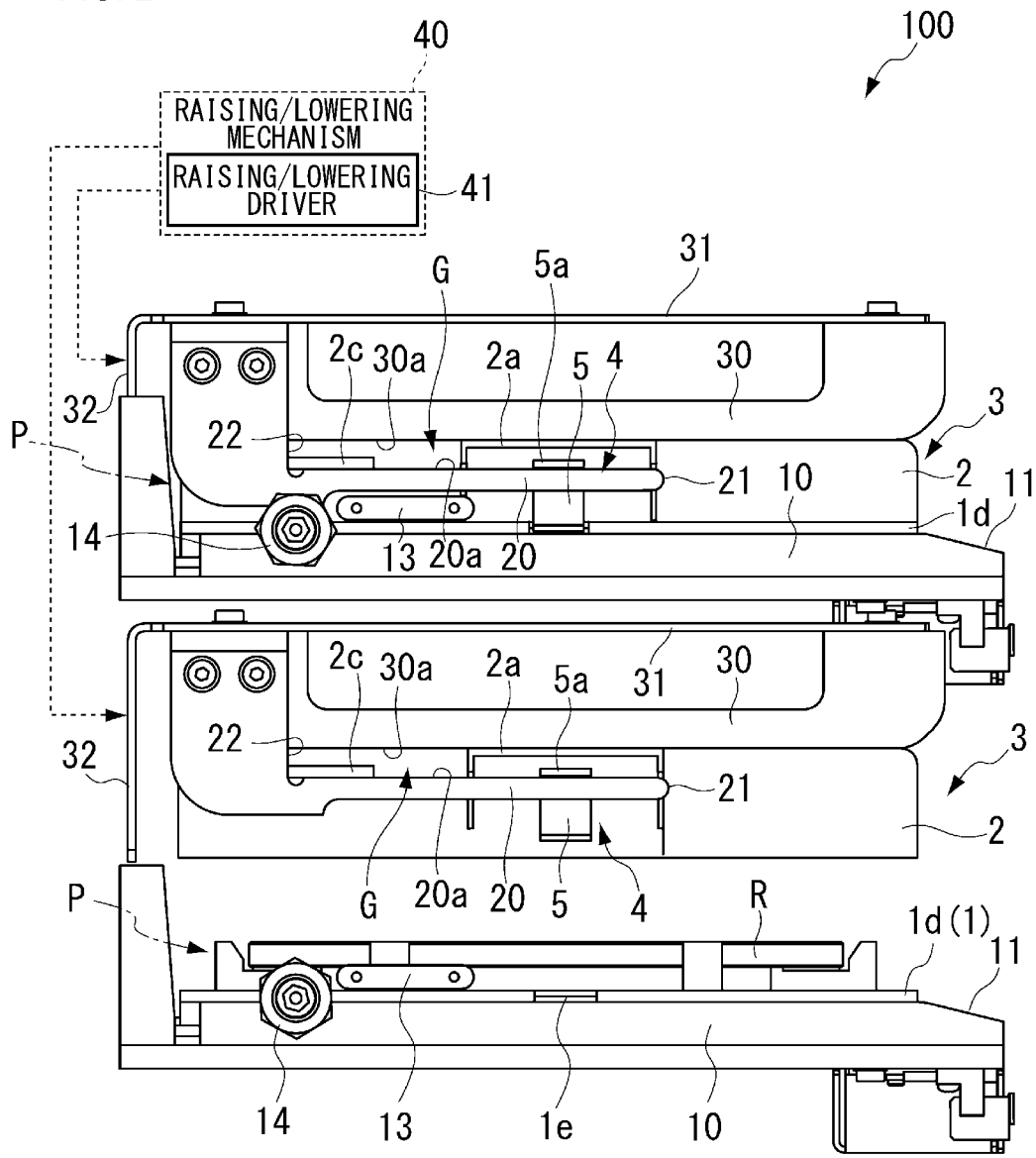
FIG. 2 is a diagram of the lid opening-and-closing device when viewed from the −X side.
Figure 3:
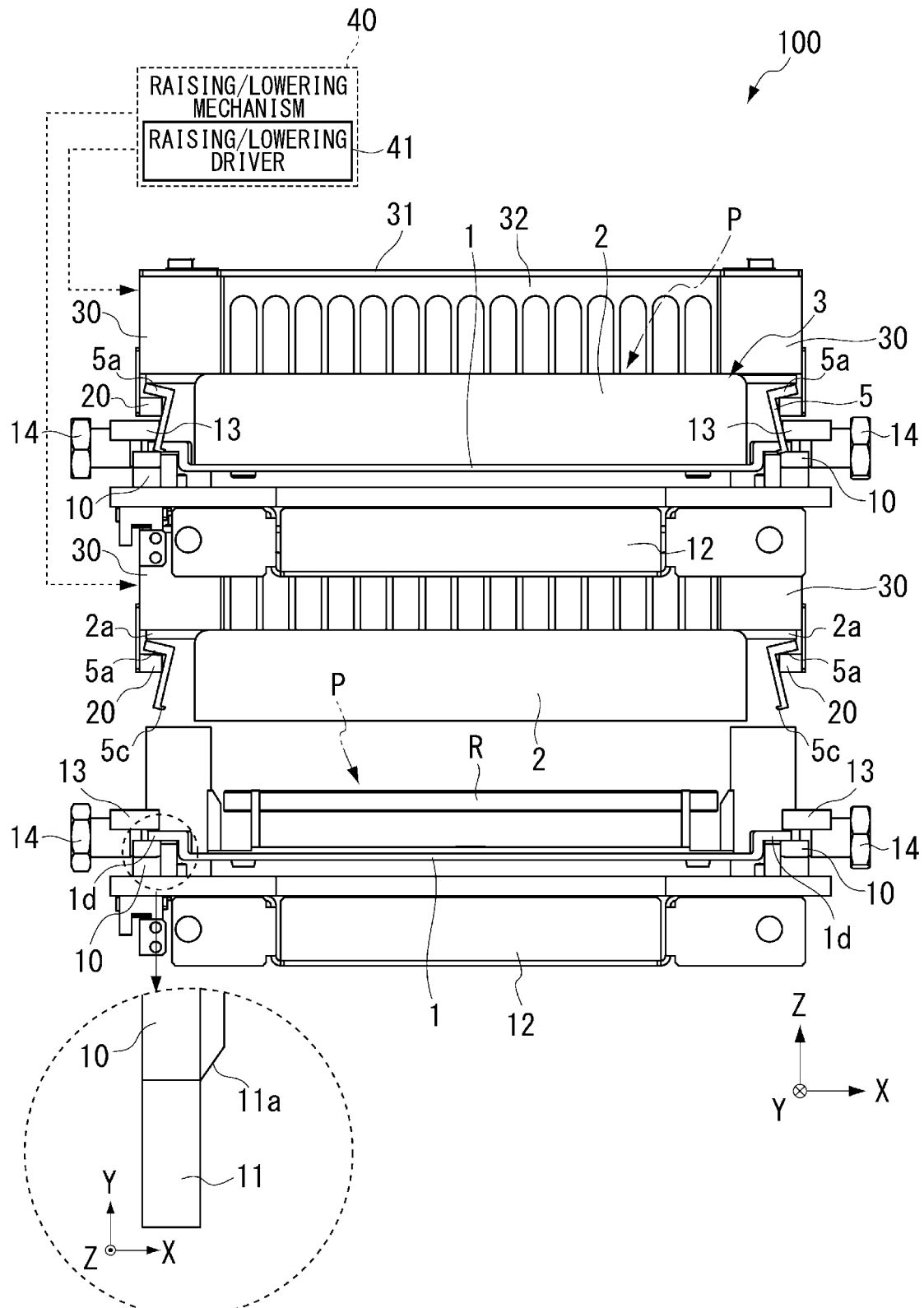
FIG. 3 is a diagram of the lid opening-and-closing device when viewed from the −Y side.

FIG. 1 is a perspective view illustrating one example of a lid opening-and-closing device 100. FIG. 2 is a diagram of the lid opening-and-closing device 100 when viewed from the −X side. FIG. 3 is a diagram of the lid opening-and-closing device 100 when viewed from the −Y side. The lid opening-and-closing device 100 illustrated in FIGS. 1 to 3 opens and closes upper lids 2 of containers 3 each of which includes a container body 1 and the corresponding upper lid 2 and accommodates an article such as a reticle.

Each container 3 includes a locking mechanism 4 that locks the corresponding upper lid 2 onto the corresponding container body 1 when the upper lid 2 is mounted on the container body 1. The container 3 is a reticle pod that accommodates a reticle R as an article. The locking mechanism 4 has a configuration in which locking is released when having rotated a strip 5a, which is provided to the upper lid 2 and extends in the horizontal direction, upward to an extent exceeding a predetermined value with respect to the container body 1. Details of the container 3 will be described later. To retrieve an accommodated article from the container 3 including the locking mechanism 4, the lid opening-and-closing device 100 of the example releases the above-described locking mechanism 4, and opens and closes the upper lid 2 with respect to the container body 1.

The lid opening-and-closing device 100 includes placement platforms 10, lower guiders (guider) 20, upper guiders 30, and a raising/lowering mechanism 40. The lid opening-and-closing device 100 illustrated in FIGS. 1 to 3 indicates an aspect in which two containers 3 are disposed in upper and lower stages. However, our devices are not limited to this configuration, and the lid opening-and-closing device 100 may have an aspect in which one container 3 is placed, or may have an aspect in which three or more containers 3 are disposed one above another. For the placement platforms 10, specified positions P at which the containers 3 are placed are specified. The placement platforms 10 are two rod-like members extending in the Y direction and are disposed in a manner aligned parallel to each other in the X direction. The placement platforms 10 support flanges 1d of the containers 3 on the +X side and flanges 1d thereof on the −X side, and the containers 3 are placed parallel to the horizontal plane.

Respective ends on the −Y side of the placement platforms 10 correspond to inlets through which the containers 3 are inserted. The containers 3 are inserted through these inlets in the +Y direction to be placed on the placement platforms 10. On the ends (inlets) of the placement platforms 10 on the −Y side, slopes 11 are formed. The slopes 11 are formed to be inclined upward (toward the +Z side) from the ends on the −Y side toward the +Y side. With the slopes 11 thus formed, the flanges 1d of each container 3 are guided from the corresponding slopes 11 to the corresponding placement platforms 10 when the container 3 is inserted, whereby the container 3 can be disposed at an appropriate height. On inner faces of the respective placement platforms 10 (faces, on the +X side, of the placement platforms 10 on the −X side, and faces, on the −X side, of the placement platforms 10 on the +X side), second slopes 11a are provided. When the container 3 is inserted, the second slopes 11a come into contact with side portions (see FIG. 4) that are each provided upright from the bottom of the corresponding container body 1 to form the flanges 1d, thereby guiding the container 3 (container body 1) to an appropriate position in the X direction for positioning. The second slopes 11a may be provided from the ends of the respective placement platforms 10 on the −Y side.

In the lid opening-and-closing device 100, at each inlet through which a container 3 is inserted, a recess 12 that is a portion recessed downward between the corresponding two placement platforms 10 is provided. With this recess 12 thus provided, for example, when the container 3 is inserted onto the placement platforms 10 by an operator or the like, or when the container 3 on the placement platforms 10 is brought out, a hand of the operator is not caught by any obstacles, and consequently the container 3 can be easily carried, whereby convenience when bringing in and out the container 3 is improved. Above the placement platforms 10 on the +Y side, pressing members 13 are provided. The pressing members 13 are disposed above upper faces of the placement platforms 10 by the thickness of the flanges 1d of the corresponding container body 1. When the container 3 is disposed at the corresponding specified position P, the pressing members 13 are disposed on the upper faces of the flanges 1d of the placement platforms 10, thereby preventing the container body 1 from moving upward.

A stopper (not illustrated) may be provided that comes into contact with the container body 1 on the +Y side when the container 3 is disposed at the specified position P. When the container 3 is disposed at the specified position P, this stopper may prevent the container body 1 from moving from the position where the container 3 is disposed toward the +Y direction, thereby positioning the container body 1 in the Y direction. The lid opening-and-closing device 100 also includes holding members 14 that prevent the containers 3 disposed at the specified positions P from coming out (moving toward the −Y direction). The holding members 14 are provided with their tips facing inward of the lid opening-and-closing device 100. Each holding member 14 includes a projection (not illustrated) that is elastically supported inward by an elastic member (not illustrated), for example. This projection is made to project by the elastic member toward the −Y side of the corresponding stepped part if (see FIG. 4) provided on each flange 1d when the corresponding container 3 is disposed at the specified position P, thereby preventing the container 3 disposed at the specified position P from moving in the −Y direction. The holding member 14 is omitted in FIGS. 6, 7 and 9.

The lower guiders 20 are provided above the respective placement platforms 10 on the +X side and the −X side. The lower guiders 20 are disposed along the direction in which the placement platforms 10 extend. When the container 3 is inserted in the horizontal direction to the specified position P of the placement platforms 10, the lower guiders 20 come into contact with lower faces of strips 5a of the locking mechanisms 4 provided to the container 3, and rotate these strips 5a upward to the extent exceeding the predetermined value with respect to the container body 1. With the lower faces of the strips 5a, upper faces 20a of the lower guiders 20 come into contact. On a tip of each lower guider 20 on the inlet side (−Y side), an inclined surface or a curved surface is provided. In this example, on the tip of the lower guider 20 on the −Y side, a curved surface 21 is provided. With the curved surfaces 21 thus provided, the strips 5a come into contact with the curved surfaces 21 when the container 3 is inserted, and thus the strips 5a can be guided appropriately onto the lower guiders 20.

An end of each lower guider 20 on the far side (+Y side) is bent upward, and is attached to the corresponding upper guider 30 described later. An upper face 20a of the lower guider 20 on the +Y side is bent upward to form a stopper 22. The stoppers 22 are brought into contact with ends, on the +Y side, of protruding pieces 2c of each container 3 disposed at the corresponding specified position P, thereby preventing the container 3 from further moving from the specified position P in the +Y direction.

The upper guiders 30 are provided above the corresponding two lower guiders 20 to extend along the lower guiders 20 in the Y direction. The upper guiders 30 and the lower guiders 20 are provided in parallel. The length of the upper guiders 30 in the Y direction is greater than that of the lower guiders 20. When the container 3 is inserted in the horizontal direction to the specified position P of the placement platforms 10, the upper guiders 30 come into contact with upper faces of side portions 2a of the corresponding upper lid 2 that are opposed to each other above the corresponding strips 5a. With the upper guiders 30 thus provided, the upper lid 2 can be pressed from above when the lower guiders 20 rotate the strips 5a upward. In other words, by sandwiching each side portion 2a and the corresponding strip 5a between the corresponding upper guider 30 and the corresponding lower guider 20, upward movement of the side portion 2a (upper lid 2) is prevented by the upper guider 30 and also the strip 5a is rotated upward by the lower guider 20.

The upper guider 30 is disposed apart from the lower guider 20 by a predetermined distance L in the up-and-down direction (Z direction) (see FIG. 8). This distance L is a distance, for example, that makes it possible to sandwich the side portion 2a of the upper lid 2 and the strip 5a between the lower guider 20 and the upper guider 30, to rotate the strip 5a upward with respect to the corresponding container body 1 to an extent exceeding the predetermined value (move the end of the strip 5a upward) while preventing upward movement of the upper lid 2, and to release locking by the corresponding locking mechanism 4. Because a lower face 30a of the upper guider 30 presses the upper face of the side portion 2a of the upper lid 2, upward movement of the upper lid 2 is prevented and locking by the locking mechanism 4 can be reliably released when the lower guider 20 rotates the strip 5a upward. Sandwiching the side portion 2a of the upper lid 2 and the strip 5a between the lower guider 20 and the upper guider 30 holds the upper lid 2. In other words, the lower guider 20 and the upper guider 30 function as a holder for the upper lid 2. The tip of the lower guider 20 and the upper guider 30 are connected by a bracket 23. The lower guider 20 extends in the −Y direction from the vicinity of the corresponding stopper 22, and is provided in a cantilevered manner. By connecting the tip of the lower guider 20 and the upper guider 30 with the bracket 23, the stiffness of the lower guider 20 is increased, whereby the tip of the lower guider 20 can be prevented from tilting down. The brackets 23 are illustrated in FIG. 1, and are omitted in other drawings.

The upper guider 30 is attached to the corresponding raising/lowering member 31 having a plate-like shape, for example, and ascends and descends accordingly as the raising/lowering member 31 ascends and descends. The lower guider 20 attached to the upper guider 30 ascends and descends accordingly as the upper guider 30 and the raising/lowering member 31 ascend and descend. In other words, the lower guider 20 and the upper guider 30 ascend and descend integrally with the raising/lowering member 31. The raising/lowering member 31 is raised and lowered by the raising/lowering mechanism 40. Driving of the raising/lowering mechanism 40 may be configured to be automatically performed by a control device (not illustrated) or the like when a sensor or the like has detected that a container 3 has been disposed at the corresponding specified position P, or may be configured to be performed by operation (manual operation) of a control panel (not illustrated) by an operator.

The raising/lowering mechanism 40 raises the corresponding upper lid 2 with respect to a container body 1 for which locking by the corresponding locking mechanisms 4 has been released. The raising/lowering mechanism 40 is not limited to being configured to raise and lower the upper lid 2 with respect to the container body 1, and may be configured to lower the container body 1 with respect to the upper lid 2, or may be configured to raise the upper lid 2 and lower the container body 1. The raising/lowering mechanism 40 includes a raising/lowering driver 41. The raising/lowering driver 41 raises and lowers the raising/lowering member 31. As the raising/lowering driver 41, for example, an air cylinder device is used. By raising and lowering the raising/lowering member 31, the lower guiders 20 and the upper guiders 30 holding the upper lid 2 can be raised and lowered with respect to the container body 1 as described above.

To an end of the raising/lowering member 31 on the +Y side, a cover 32 is provided. The cover 32 is provided in a manner bent downward from the end of the raising/lowering member 31 on the +Y side, and is disposed extending downward from the end of the raising/lowering member 31. The cover 32 is provided in a fence-like shape, for example, and provides restriction so that the operator will not further put his/her hand that has already been placed in the casing 70 to an area where various devices (e.g., a transport device for reticles R) disposed farther than the casing 70 operate. The cover 32 ascends and descends integrally with the raising/lowering member 31, is disposed on the +Y side (an opening (not illustrated) provided on a back plate 73 of the casing 70) of the placement platform 10 when the raising/lowering member 31 descends, and ascends together with the raising/lowering member 31 as the raising/lowering member 31 ascends, thereby opening the +Y side of the container body 1. Thus, when the upper lid 2 is raised, a reticle R placed on the container body 1 can be brought into and out from the +Y side (the opening (not illustrated)) of the lid opening-and-closing device 100.

Figure 4:
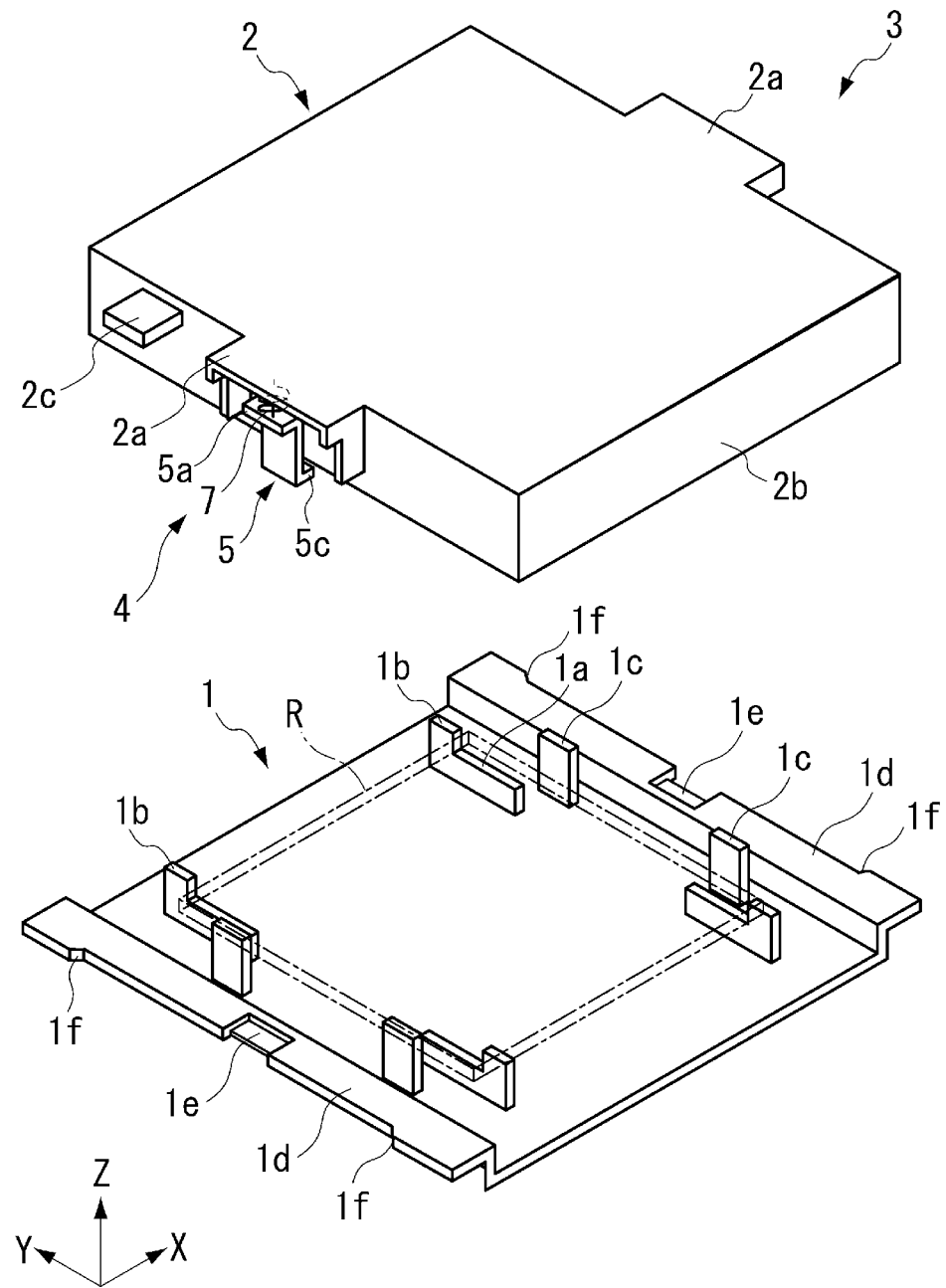
FIG. 4 is an exploded perspective view illustrating one example of a container.
Figure 5A:
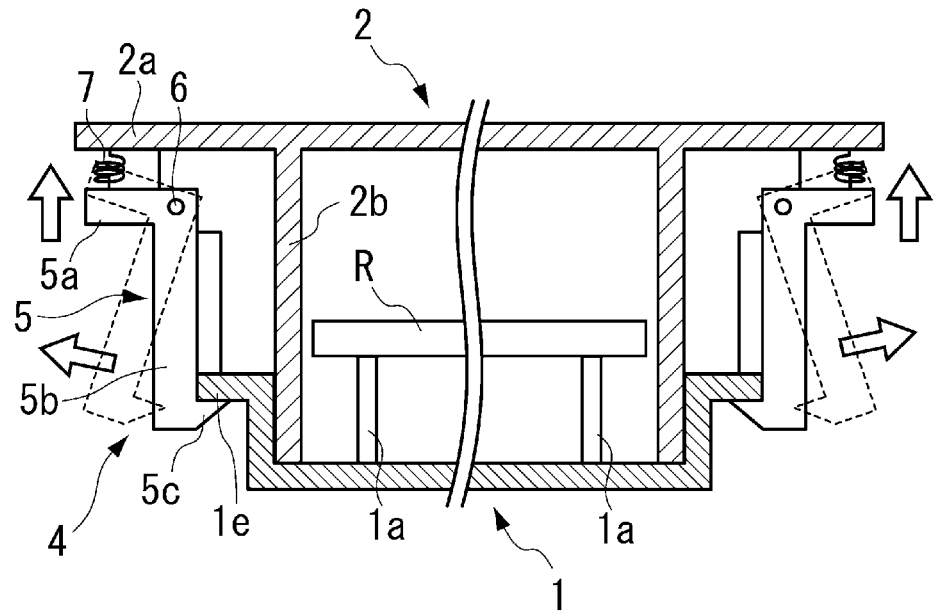
FIG. 5(A) is a diagram in which locking of the container by a locking mechanism is released.
Figure 5B:
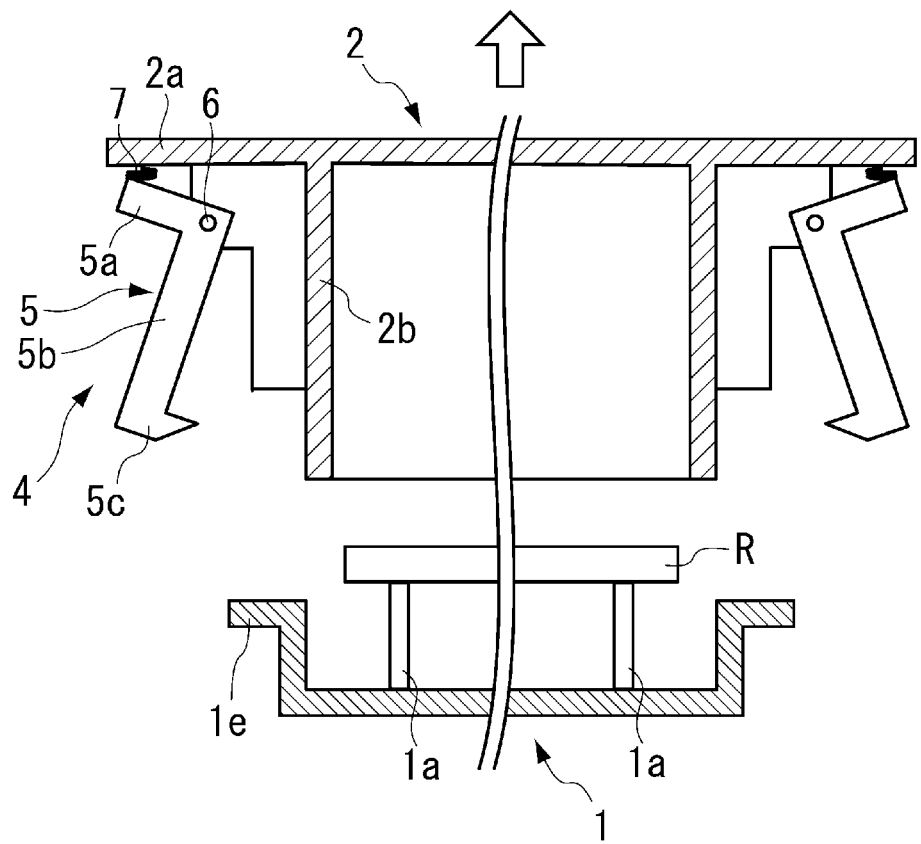
FIG. 5(B) is a diagram in which an upper lid is moved upward from a container body.

FIG. 4 is an exploded perspective view illustrating one example of each container 3. FIG. 5(A) is a diagram in which locking of the container 3 by the corresponding locking mechanisms 4 is released, and FIG. 5(B) is a diagram in which the upper lid is moved upward from the container body. As illustrated in FIGS. 4 and 5, the container body 1 has a rectangular plate-like shape, for example. The container body 1 has a plurality of supports 1a that support a rectangular plate-like reticle R. The supports 1a are disposed at four respective locations corresponding to the corners of the reticle R. On the respective supports 1a, positioning portions 1b are formed. The positioning portions 1b support the +Y side and the −Y side of the reticle R to prevent the reticle R from being displaced in the Y direction. On the container body 1, positioning portions 1c are formed. The positioning portions 1c support the +X side and the −X side of the reticle R to prevent the reticle R from being displaced in the X direction. A method of supporting the reticle R in the container body 1 is optional, and is not limited to the configuration described above.

The container body 1 has flanges 1d on the +X side and the −X side thereof. The flanges 1d are formed along two edges of the container body 1 opposed to each other. The flanges 1d extend along the Y direction, and are parallel to the bottom of the container body 1. Side portions are formed upright on the bottom along the Z direction, and the flanges 1d are formed from these side portions in a flanged shape extending in the X direction. These flanges 1d are arranged higher than the bottom of the container body 1 by stepped portions. A part of each flange 1d has a locked portion 1e. The locked portion 1e is formed in an approximate center of the flange 1d in the Y direction that is the longitudinal direction thereof. On edges of each flange 1d on the +Y side and the −Y side, stepped parts 1f are formed. This stepped part 1f (stepped part 1f on the +Y side) is locked by a protrusion (not illustrated) of the corresponding holding member 14 (see FIG. 1, for example) described above when the container 3 is disposed at the corresponding specified position P, whereby the container 3 is prevented from moving in the −Y direction.

Each upper lid 2 has the side portions 2a, a side wall 2b, and the protruding pieces 2c. The side portions 2a are formed on a top plate thereof, which is rectangular in plan view, for example, in a manner protruding therefrom each on the +X side and the −X side. The side wall 2b has a shape of a rectangular frame in plan view, and is formed along the outer periphery of the top plate. The side wall 2b is formed in a size that can be inserted between the two flanges 1d of the container body 1 (a pair of side portions formed upright on the bottom thereof). The respective protruding pieces 2c are provided on the +Y side of the side portions 2a in a manner protruding outward from the side wall 2b. The thickness dimension of each protruding piece 2c is set so that the protruding piece 2c can be inserted between the corresponding lower guider 20 and the corresponding upper guider 30 described above. Ends of the protruding pieces 2c on the +Y side come into contact with the stoppers 22 of the corresponding lower guider 20, and thus the protruding pieces 2c define the position in a direction in which the container 3 is inserted onto the corresponding placement platforms 10.

The container 3 includes the locking mechanism 4. The locking mechanism 4 includes a locking member 5, a shaft 6, and an elastic member 7. The locking member 5, the shaft 6, and the elastic member 7 are provided to the corresponding upper lid 2. The locking member 5 is disposed below the side portion 2a. The locking member 5 has the strip 5a, a flap 5b, and a claw 5c. The strip 5a extends in the horizontal direction along the side portion 2a, and is disposed below the side portion 2a with a predetermined spacing therebetween. The flap 5b is a portion that is bent downward from the strip 5a on the side wall 2b side. The claw 5c is formed on the lower end of the flap 5b, and is locked on the corresponding locked portion 1e of the container body 1.

The shaft 6 is disposed in the strip 5a on the side wall 2b side, and provided to the upper lid 2 (side portion 2a) such that its axial direction corresponds to the Y-axis direction. The shaft 6 rotatably supports the locking member 5. Specifically, the locking member 5 is rotatable about the shaft 6. In other words, the strip 5a is provided rotatably about the shaft 6, and when the strip 5a rotates, the positions of the flap 5b and the claw 5c with respect to the container body 1 (locked portion 1e) change accordingly. When the strip 5a rotates upward (in the +Z-axis direction) about the shaft 6, the flap 5b and the claw 5c are separated from the container body 1. When the strip 5a rotates downward (in the −Z-axis direction) about the shaft 6, the flap 5b and the claw 5c approaches the container body 1. The elastic member 7 is disposed between the strip 5a and the side portion 2a. The elastic member 7, for which a coil spring or the like is used, for example, applies a downward elastic force to the strip 5a.

As illustrated in FIG. 5(A), when a force greater than the elastic force of the elastic member 7 is applied upward to the strip 5a, the strip 5a rotates in a direction in which the end thereof approaches the corresponding side portion 2a, and consequently, the corresponding locking member 5 rotates about the corresponding shaft 6. When the strip 5a has rotated upward with respect to the container body 1 to an extent exceeding the predetermined value, or when the distance between the upper face of the side portion 2a and the lower face of the end of the strip 5a has become smaller than the predetermined distance L (see FIG. 8), the corresponding claw 5c is separated from the container body 1 to be in a state of being disengaged from the corresponding locked portion 1e. The claws 5c are disengaged from the locked portions 1e, whereby locking of the upper lid 2 by the locking mechanisms 4 is released. In the state in which locking of the upper lid 2 by the locking mechanisms 4 has been released, each claw 5c and the corresponding locked portion 1e do not overlap each other in plan view.

As illustrated in FIG. 5(B), in the state in which the locking by the locking mechanisms 4 has been released, the upper lid 2 is separated from the container body 1 by moving the upper lid 2 upward. Consequently, the upper lid 2 is removed from the container body 1, and the container 3 becomes open (in a state in which a reticle R can be retrieved therefrom or placed thereon). In the state in which the locking by the locking mechanisms 4 has been released, also by lowering the container body 1, the container 3 comes into a state of having moved upward from the container body 1. When the upper lid 2 is mounted on the container body 1 and this container 3 is brought out from the placement platforms 10 (i.e., when the strips 5a are separated from the lower guiders 20), the strips 5a are pressed by the elastic members 7 to be rotated downward, the locking members 5 are accordingly rotated, the claws 5c are accordingly brought closer to the container body 1, and thus the claws 5c are locked on the locked portions 1e again.

Figure 6:
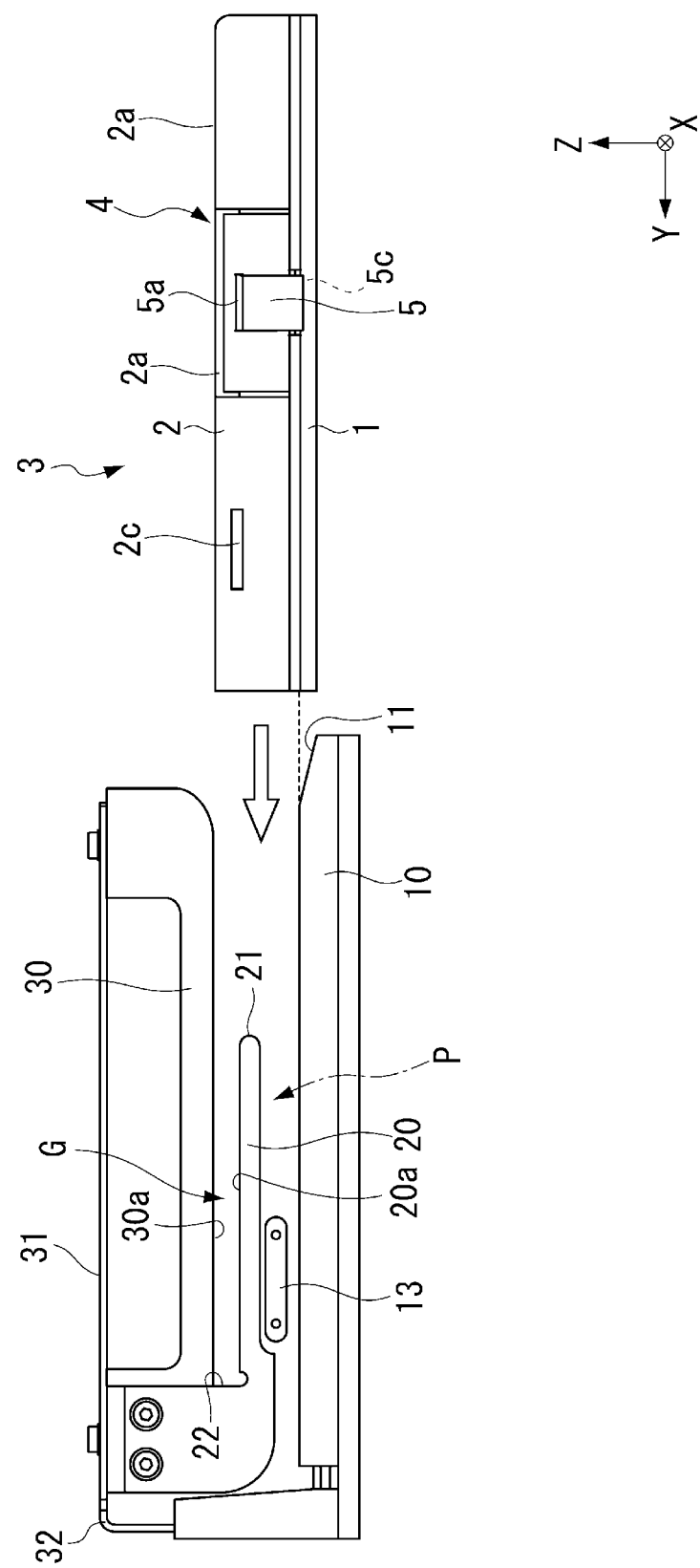
FIG. 6 is a diagram illustrating a state before the container is disposed on a placement platform.

The following describes one example of operation of opening the upper lid 2 of each container 3 disposed in the above-described lid opening-and-closing device 100 with reference to FIGS. 6 to 9. In FIGS. 6 to 9, one container 3 is illustrated as an example. FIG. 6 is a diagram illustrating a state before the container 3 is disposed onto the corresponding placement platforms 10. As illustrated in FIG. 6, on the near side (the −Y side) of the inlet of one placement platform 10, the container 3 is disposed. This container 3 may be held by a hand of an operator, for example, or may be held by a robot hand or the like.

The container 3 is disposed such that the flanges 1d of the container 3 are positioned at the height of the placement platforms 10, for example. From this state, the container 3 is inserted in the +Y direction, whereby the container 3 is disposed at the corresponding specified position P. When the container 3 is inserted, even if the height of the flanges 1d is lower than that of the placement platforms 10, the flanges 1d come into contact with the corresponding slopes 11 to be guided, whereby the container 3 can be inserted with the flanges 1d being placed on the placement platforms 10. When the container 3 has been inserted, the strips 5a of the locking mechanisms 4 thereof reach the curved surfaces 21 of the corresponding lower guiders 20. These strips 5a come into contact with the curved surfaces 21 to be appropriately guided onto the lower guiders 20. When the strips 5a have been guided onto the lower guiders 20, the strips 5a are rotated upward by the lower guiders 20. In other words, during the process of inserting the container 3 to the specified position P, the strips 5a have been rotated upward by the lower guiders 20.

Meanwhile, when the container 3 has been inserted, the side portions 2a of the upper lid 2 thereof come into contact with the corresponding upper guiders 30 to be guided. When the container 3 is inserted, the timing when the side portions 2a start being in contact with the upper guiders 30 is earlier than the timing when the strips 5a start being guided by the lower guiders 20. From the middle of the insertion, the container 3 is inserted to the specified position P with the side portions 2a being guided by the upper guiders 30 and also with the strips 5a being guided by the lower guiders 20. When the strips 5a have been rotated upward by the lower guiders 20, locking by the locking mechanisms 4 has been released. The container 3 is inserted until the protruding pieces 2c thereof come into contact with the corresponding stoppers 22. The operator can easily dispose the container 3 at the specified position P by inserting it until the container 3 stops (until it cannot be pushed further).

Figure 7:
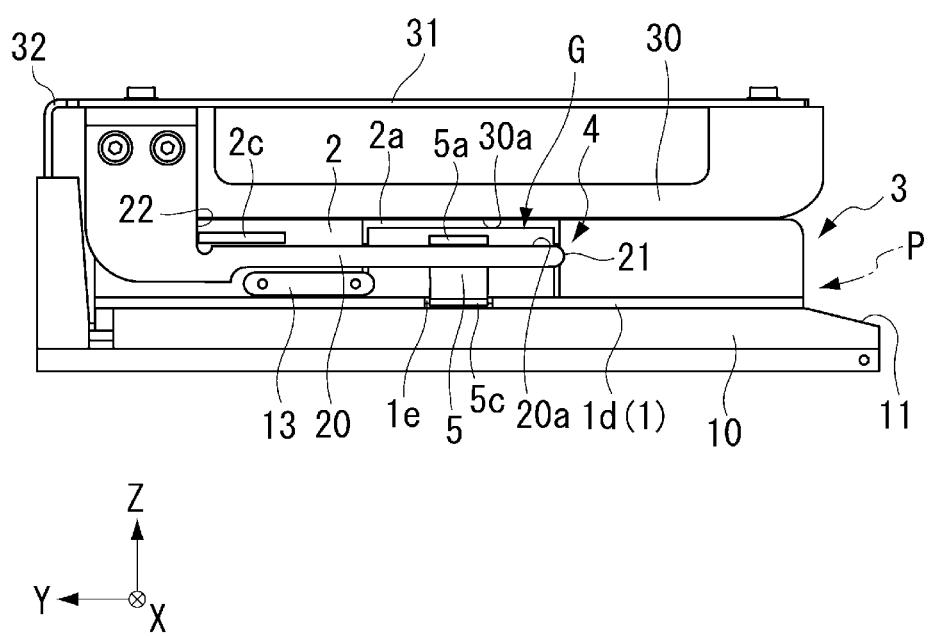
FIG. 7 is a diagram illustrating a state in which the container is disposed at a specified position of the placement platform.
Figure 8A:
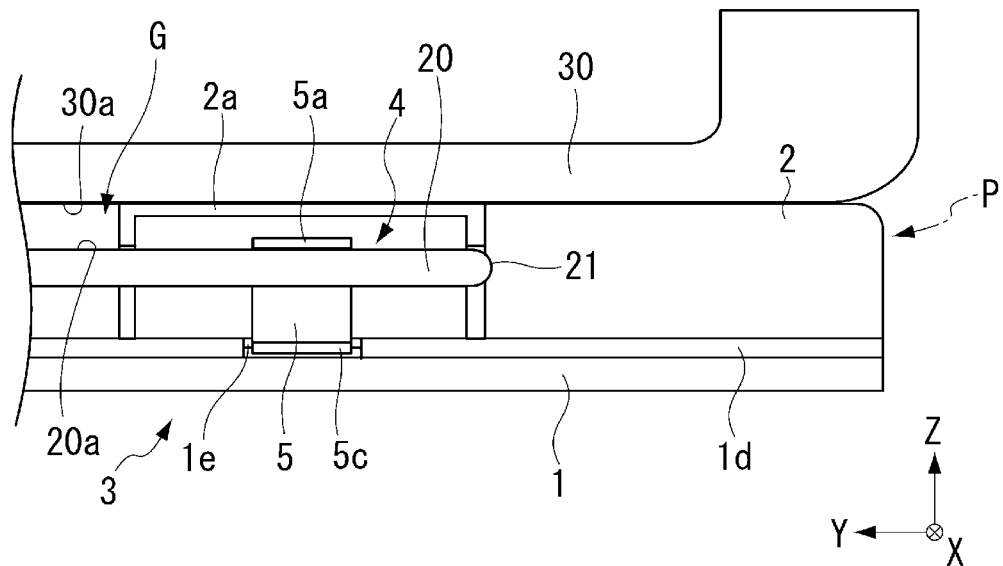
FIG. 8(A) is a diagram illustrating a main part in FIG. 7 in an enlarged manner.
Figure 8B:
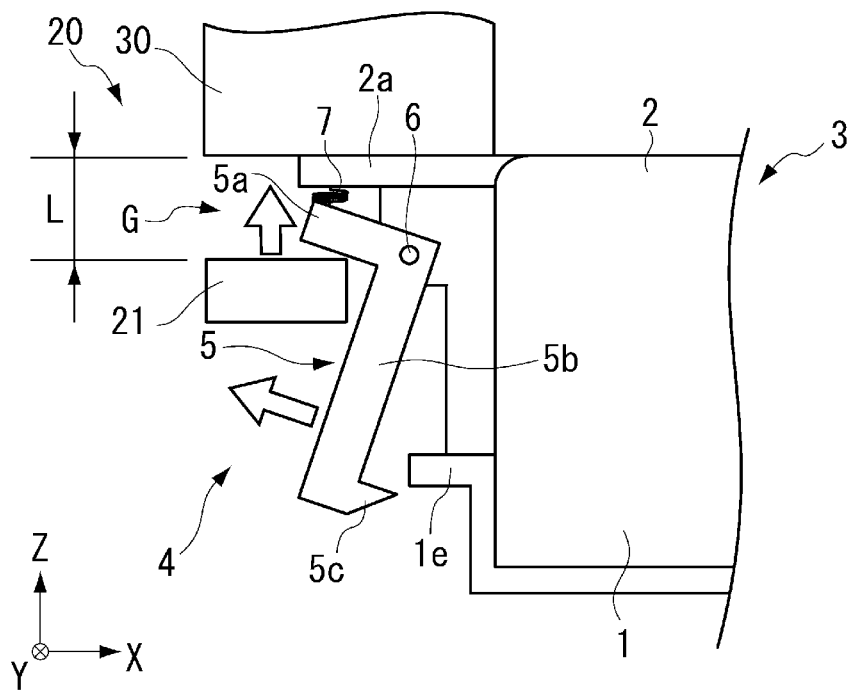
FIG. 8(B) is a diagram illustrating a state in which a locking mechanism has been released in the state illustrated in FIG. 7.

FIG. 7 is a diagram illustrating a state in which the container 3 is disposed at the specified position P. FIG. 8(A) is a diagram illustrating a main part in FIG. 7 in an enlarged manner. FIG. 8(B) is a diagram schematically illustrating one example of a locking mechanism 4 of the upper lid 2 in the state illustrated in FIG. 7. As illustrated in FIG. 7, in the state in which the container 3 is disposed at the specified position P of the corresponding placement platforms 10, each side portion 2a and the corresponding strip 5a are sandwiched between the corresponding lower guider 20 and the corresponding upper guider 30, and the upper lid 2 is supported by the lower guider 20 and the upper guider 30.

As illustrated in FIGS. 8(A) and (B), the strips 5a on both sides of the upper lid 2 are guided by the lower guiders 20, and the strips 5a are rotated upward with respect to the container body 1 (container 3) against the elastic forces of the elastic members 7. The upper faces of the side portions 2a of the upper lid 2 are in contact with the lower faces 30a of the upper guiders 30. When the strips 5a are rotated upward, forces acting upward are applied to the upper lid 2. Because these forces are received by the upper guiders 30, the position of the upper lid 2 in the up-and-down direction is maintained. As illustrated in FIG. 8(B), the distance between the upper face 20a of each lower guider 20 and the lower face 30a of the corresponding upper guider 30 is set to the predetermined distance L. This predetermined distance L is a distance needed to rotate the corresponding strip 5a upward to release locking by the corresponding locking mechanism 4. In other words, the strip 5a is rotated upward by the lower guider 20 until the predetermined distance L is reached, whereby the locking by the locking mechanism 4 can be reliably released.

The side portions 2a are prevented from moving upward by the upper guiders 30. Thus, when the strips 5a are rotated upward, the upper lid 2 can be prevented from moving upward, and the strips 5a can be reliably rotated upward with respect to the container body 1. By this upward rotation of the strips 5a, the locking members 5 rotate about the shafts 6, and the claws 5c are disengaged from the locked portions 1e of the container body 1. Consequently, locking by the locking mechanisms 4 is released, and the upper lid 2 can be moved upward from the container body 1. As long as the container 3 is disposed at the specified position P, the state in which locking by the locking mechanisms 4 is released is maintained.

Figure 9:
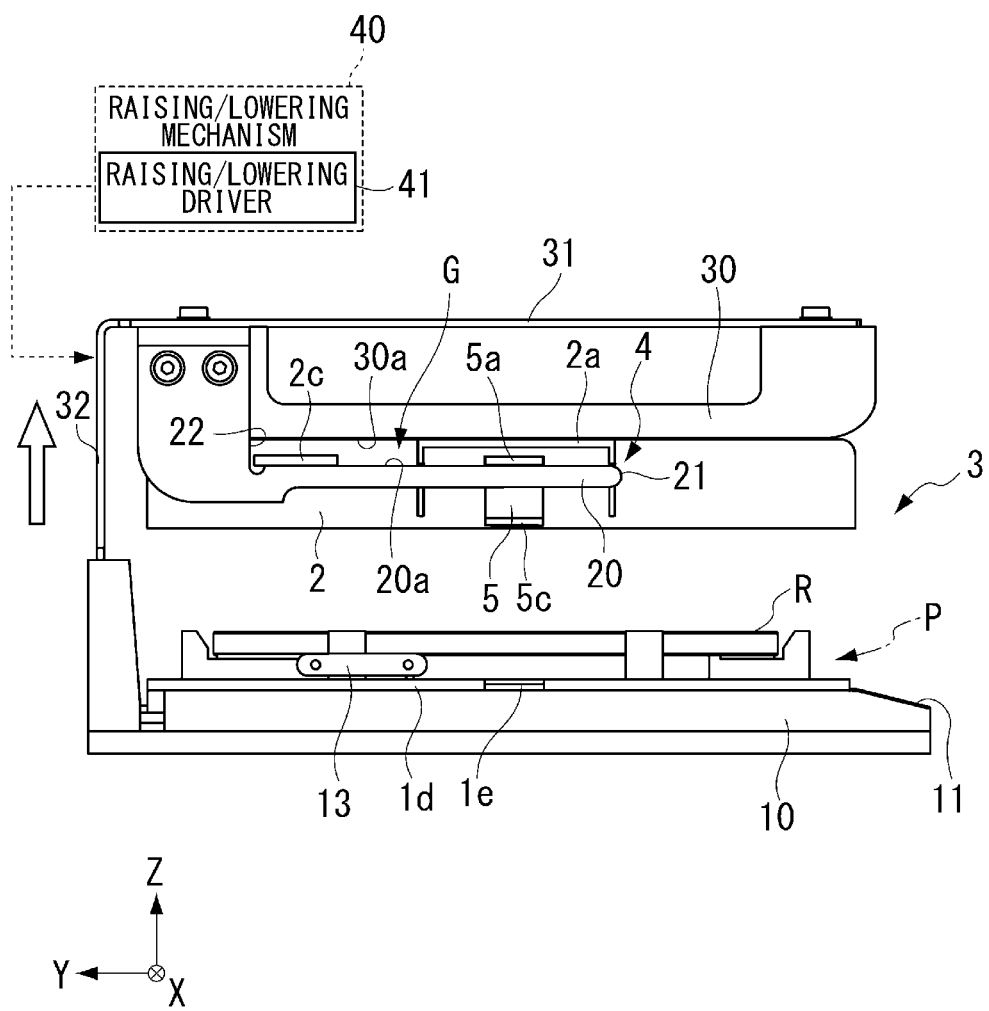
FIG. 9 is a diagram illustrating one example of operation of moving the upper lid upward.

FIG. 9 is a diagram illustrating one example of operation of opening the upper lid 2. As illustrated in FIG. 9, the raising/lowering member 31 is raised by the raising/lowering driver 41 of the raising/lowering mechanism 40, whereby the lower guiders 20 and the upper guiders 30 integrated with the raising/lowering member 31 are raised. Because the side portions 2a on both sides of the upper lid 2 and the strips 5a are sandwiched between the lower guiders 20 and the upper guiders 30 to be held, when the lower guiders 20 and the upper guiders 30 ascend, the upper lid 2 accordingly ascends with respect to the container body 1. When the upper lid 2 ascends, the upper side of the container body 1 becomes open, and a reticle R can be retrieved from or placed into the container body 1.

On the upper faces 20a of the lower guiders 20, lower faces of the strips 5a slide, and on the lower faces 30a of the upper guiders 30, the upper faces of the side portions 2a of the upper lid 2 slide. Thus, one or both of the upper face 20a of each lower guider 20 and the lower face 30a of each upper guider 30, processing to reduce friction may be applied, or a coating to reduce friction may be formed. By using such a configuration in which friction is reduced, generation of particles when the container 3 is inserted or brought out can be reduced. The upper face 20a of each lower guider 20 may be formed such that an inner area thereof is inclined downward to be in surface contact with the lower face of the corresponding strip 5a in a state in which locking by the corresponding locking mechanism 4 has been released, that is, a state in which the strip 5a has been rotated upward. With this configuration, the strips 5a are stably supported by the lower guiders 20.

As described above, with the lid opening-and-closing device 100 according to one example, when the container 3 is inserted in the horizontal direction to the specified position P of the placement platforms 10, the lower guiders 20 come into contact with the lower faces of the strips 5a, and rotate the strips 5a upward to an extent exceeding the predetermined value with respect to the container body 1 to release the locking mechanisms 4. In other words, because the locking mechanisms 4 of the container 3 are released only by inserting the container 3 to the specified position P of the placement platforms 10 in the horizontal direction, an actuator to release the locking mechanisms 4 is not necessary and upsizing of the device can be suppressed. Furthermore, because a movable component such as an actuator is not provided, generation of particles can be reduced.

Second Example

Figure 10:
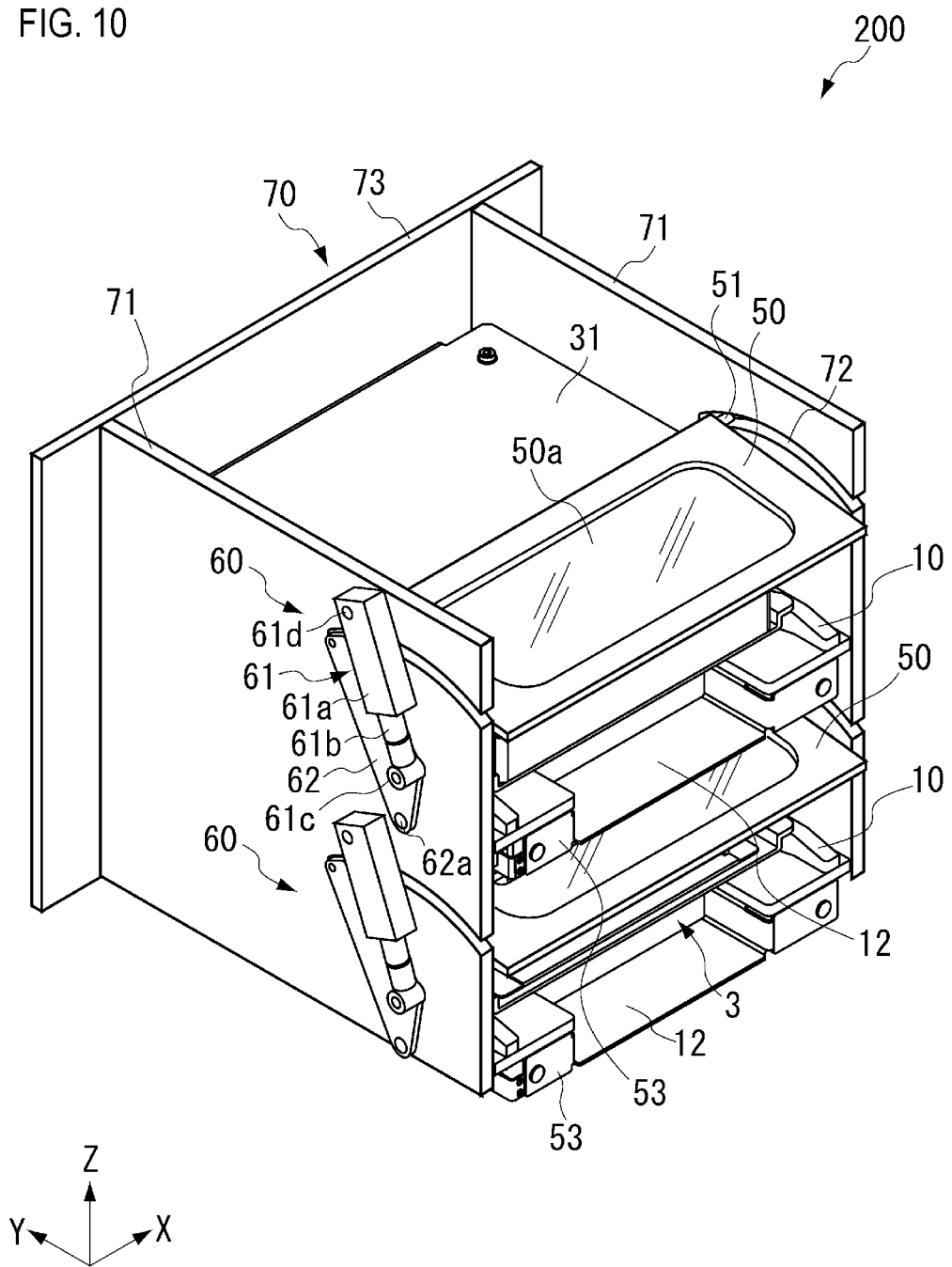
FIG. 10 is a perspective view illustrating another example of a lid opening-and-closing device.

FIG. 10 is a perspective view illustrating another example of a lid opening-and-closing device 200. As illustrated in FIG. 10, the lid opening-and-closing device 200 includes: in addition to the configuration of the lid opening-and-closing device 100 according to the first example, shutters 50 that can open and close the inlets through which the containers 3 are inserted; shutter drives 60 that open and close the shutters 50; and a casing 70 that houses the above-described lid opening-and-closing device 100. For each inlet through which a container 3 is inserted (for the corresponding placement platforms 10), the corresponding shutter 50 and the corresponding shutter drive 60 are provided. The casing 70 includes two side walls 71 and a back plate 73. The side walls 71 are disposed each on the +X side and the −X side of the lid opening-and-closing device 200. In the lid opening-and-closing device 200 illustrated in FIG. 10, illustration of the raising/lowering mechanism 40 is omitted. In the back plate 73 of the casing 70, an opening (not illustrated) is formed. This opening is formed to correspond to each container 3 placed on the corresponding placement platforms 10. Through the opening (not illustrated), a reticle R accommodated in the container 3 is retrieved, or a reticle R is placed into the container 3.

The shutters 50, each having a plate-like shape, for example, are disposed between the two side walls 71 of the casing 70. Each shutter 50 is provided with a window 50a through which inside of the casing 70 can be visually checked. The shutter 50 is movable between a closed state in which the corresponding inlet through which a container 3 is inserted is closed and an open state in which the inlet is open. A direction along which the plane of the shutter 50 extends in the closed state is the up-and-down direction, and a direction along which the plane thereof extends in the open state is the horizontal direction or an approximate horizontal direction. The shutter 50 is provided with couplers 51 on both sides in the X direction, which are each positioned on an upper end side thereof in the closed state. In each of the two side walls 71, slits 72 that correspond to tracks along which the couplers 51 move are formed. The shutter 50 is provided in a manner suspended from the couplers 51 (in a manner cantilevered by the couplers 51). Each slit 72 is formed in an arc shape that protrudes upward when viewed in the X direction. The length of the slit 72 in its longitudinal direction is set to a length needed to put the shutter 50 into the open state. The width of the slit 72 (the length thereof orthogonal to the longitudinal direction) is set to a width needed for the corresponding coupler 51 to move.

Each shutter 50 includes a magnet 52 on an inner face thereof, which is positioned on a lower side thereof in the closed state (see FIGS. 11 and 12, for example). The lid opening-and-closing device 200 includes, below the placement platforms 10, stuck members 53 to each of which the corresponding magnet 52 sticks. The stuck members 53 may be provided to the shutters 50, and the magnets 52 may be provided below the placement platforms 10.

Each shutter drive 60 includes a driver 61, a link member 62, and a shutter support roller 63 (see FIG. 12). As the driver 61, an air cylinder device, for example, is used. However, our devices are not limited to this configuration, and other configurations may be used including an electric motor and a ball screw mechanism, for example. The driver 61 according to this example includes a cylinder 61a and a shaft 61b. The cylinder 61a is supported on the corresponding side wall 71 by an axis member 61d provided along the X direction. The cylinder 61a is rotatable about the axis member 61d around the X-axis. The shaft 61b is movable to reciprocate in a direction of being extended from the cylinder 61a and a direction of being retracted into the cylinder 61a. On a tip of the shaft 61b, a bearing 61c is provided.

The link member 62 connects the driver 61 of the shutter drive 60 to the coupler 51 of the shutter 50 to transmit a driving force of the driver 61 to the shutter 50 via the coupler 51. The link member 62 is a plate-like body having a triangular shape, for example. One corner out of the three corners of the link member 62 is supported on the side wall 71 by the axis member 62a. The link member 62 is rotatable about the axis member 62a around the X-axis. One corner different from the above-described one out of the three corners of the link member 62 is connected to the bearing 61c on the tip of the shaft 61b. The link member 62 is rotatable relatively to the bearing 61c around the X-axis. One corner different from the above-described two out of the three corners of the link member 62 is connected to the coupler 51. The link member 62 is rotatable relatively to the coupler 51 around the X-axis.

FIGS. 11(A) to (C) and FIGS. 12(A) to (C) are diagrams illustrating one example of operation of opening and closing the shutters 50. FIG. 11 illustrates a state outside the side wall 71, and FIG. 12 illustrates a state inside the side wall 71. Opening and closing of the shutters 50 may be automatically performed by a control device (not illustrated), or may be performed by manual operation by an operator. The two shutters 50 are driven simultaneously in FIGS. 11 and 12, but can be driven individually.

Figure 11A:
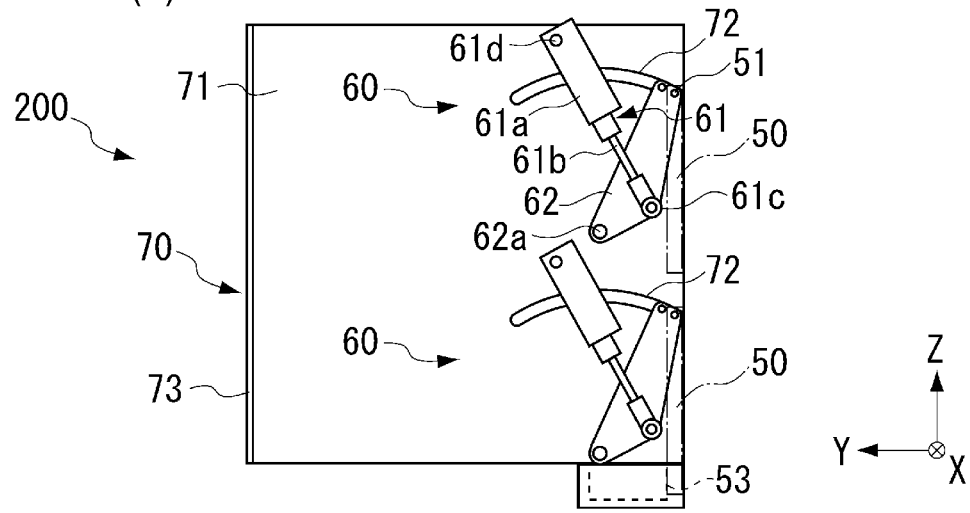
FIGS. 11(A) to (C) are diagrams illustrating one example of operation of opening and closing shutters, illustrating states outside a side wall.
Figure 12A:
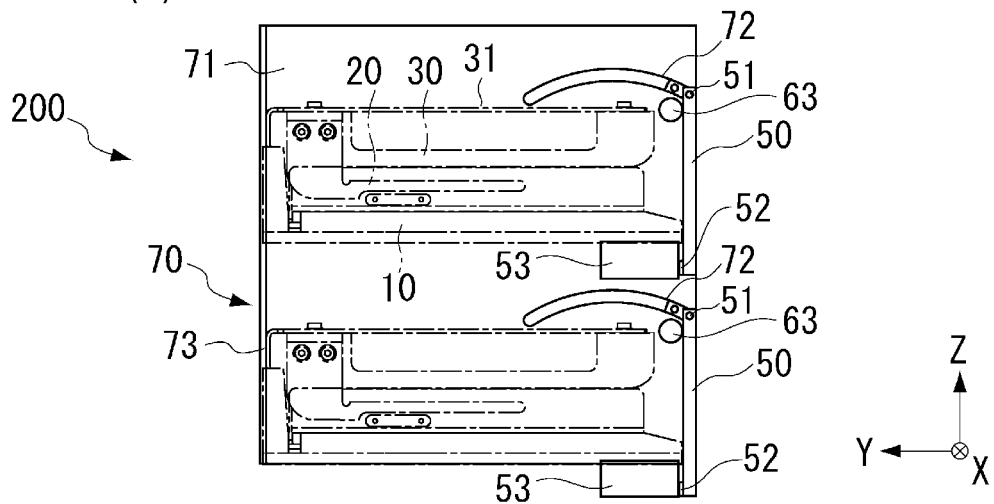
FIGS. 12(A) to (C) are diagrams illustrating one example of operation of opening and closing the shutters, illustrating states inside the side wall.

As illustrated in FIG. 11(A), with the shaft 61b of each driver 61 projecting from the corresponding cylinder 61a by a predetermined length, the corresponding link member 62 is disposed at an end in the clockwise rotational direction about the corresponding axis member 62a. In this example, as illustrated in FIG. 12(A), the coupler 51 of the corresponding shutter 50 is disposed at an end of the corresponding slit 72 on the near side thereof (−Y side). In this position of the coupler 51, the shutter 50 is hung on the near side of the corresponding shutter support roller 63, whereby the shutter 50 is in the closed state. The magnet 52 disposed on the lower end of the shutter 50 in the closed state has stuck to the corresponding stuck member 53. Thus, the closed state of the shutter 50 is maintained.

When the shutter 50 is in the closed state, particles are prevented from entering from outside. As illustrated in FIG. 12(A), the shutter 50 is not present above the corresponding raising/lowering member 31 (the lower guider 20 and the upper guider 30). Thus, when the shutter 50 is in the closed state, the lower guider 20 and the upper guider 30 can be raised or lowered without contact with the shutter 50. Meanwhile, because the corresponding inlet through which a container 3 is inserted is closed by the shutter 50, the container 3 cannot be inserted.

Figure 11B:
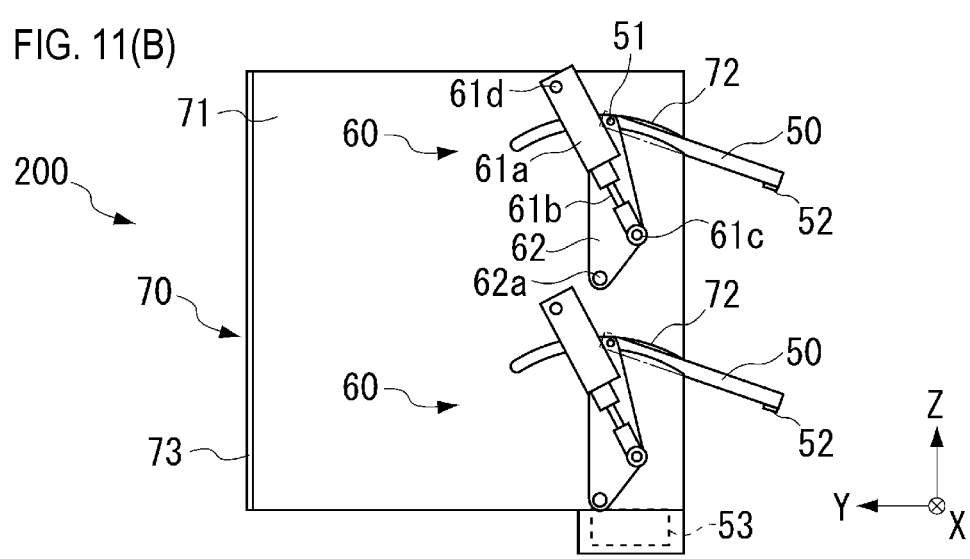
Figure 12B:
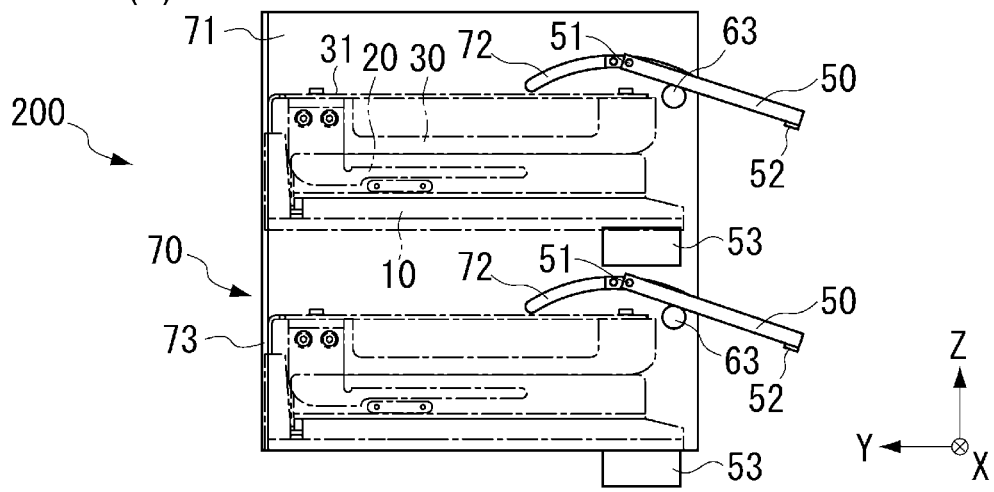

Subsequently, as illustrated in FIG. 11(B), by moving the shaft 61b in a direction in which it is retracted into the cylinder 61a (in a contracting direction), the link member 62 is rotated counterclockwise about the axis member 62a. By this rotation of the link member 62, as illustrated in FIG. 12(B), the coupler 51 is pulled toward the far side (+Y side) and the shutter 50 is accordingly rotated with the shutter support roller 63 serving as a fulcrum, whereby the magnet 52 is detached from the stuck member 53 and the shutter 50 is gradually opened. The shutter 50 is then moved toward the far side (+Y direction) with the inner surface of the shutter 50 being supported by the shutter support roller 63.

Figure 11C:
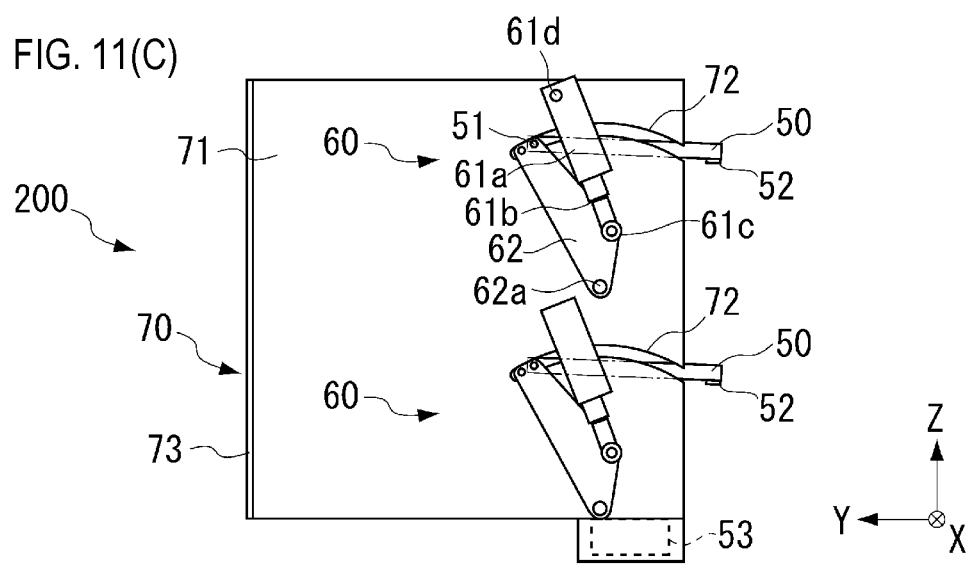
Figure 12C:
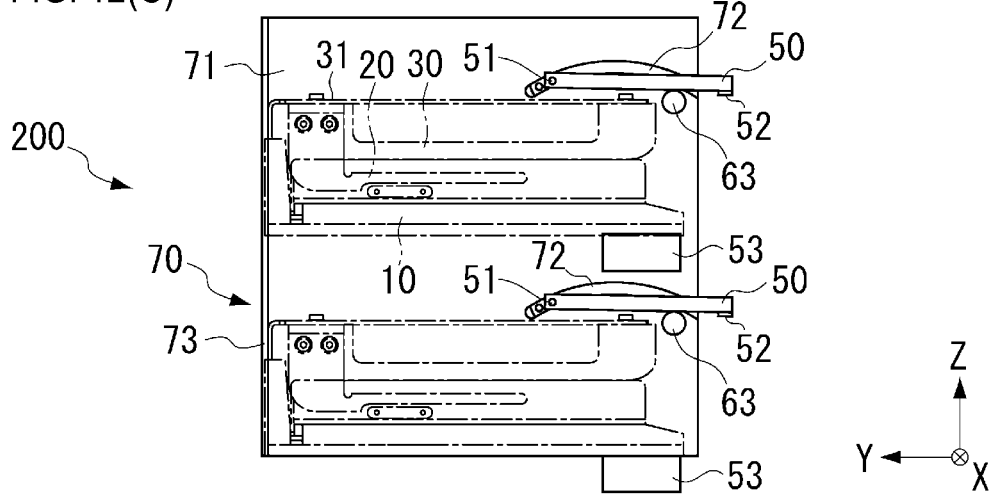

As illustrated in FIG. 11(C), when the shaft 61b has been further retracted into the cylinder 61a, the link member 62 is further rotated counterclockwise about the axis member 62a. By this rotation of the link member 62, as illustrated in FIG. 12(C), the coupler 51 is moved to the end of the slit 72 on the far side (+Y side). By this movement of the coupler 51, shutter 50 is moved to the far side (+Y direction) with the inner surface of the shutter 50 being supported by the shutter support roller 63. Consequently, the shutter 50 is positioned approximately parallel to the horizontal direction, a part of the shutter 50 that is upper in the closed state is retracted into the casing 70, and the shutter 50 is set in the open state.

When the shutter 50 is in the open state, the inlet through which a container 3 is inserted is set open. Thus, the container 3 can be inserted onto the corresponding placement platforms 10 without contact with the shutter 50. When the shutter 50 is in the open state, the shutter 50 is disposed above the raising/lowering member 31 (the lower guider 20 and the upper guider 30). Thus, the raising/lowering member 31 (the lower guider 20 and the upper guider 30) cannot be raised or lowered because of contact with the shutter 50. Consequently, in the open state of the shutter 50, a situation in which the corresponding upper lid 2 is raised from the container body 1 and the reticle R therein is exposed can be prevented.

When the shutter 50 is set from the open state into the closed state, the above-described operations are performed in reverse order, whereby the coupler 51 is positioned to the near side (−Y side) of the slit 72. Consequently, the shutter 50 is hung from the coupler 51, and the inlet through which the container 3 is closed as illustrated in FIGS. 11(A) and 12(A).

As described above, with the lid opening-and-closing device 200 according to the second example, similarly to the first example, because the locking mechanisms 4 of the container 3 are released only by inserting the container 3 to the specified position P of the placement platforms 10 in the horizontal direction, upsizing of the device can be suppressed. Furthermore, with the lid opening-and-closing device 200, because the shutter 50 that can open and close the inlet of the container 3 is provided, outside air can be prevented from flowing into the lid opening-and-closing device 200.

Although the examples have been described above, this disclosure is not limited to the above description, and various modifications may be made within the scope not departing from the gist of the appended claims. For example, in the above examples, a representative configuration has been described in which the slope 11 is formed on the end of each placement platform 10 on the inlet side. However, our devices are not limited to this configuration, and a configuration in which the slope 11 is not formed may be used. Instead of the slope 11, a curved surface may be formed.

In the above examples, a representative configuration has been described in which the curved surface 21 is formed on the tip of each lower guider 20 on the inlet side. However, our devices are not limited to this configuration, and a configuration in which an inclined surface is formed instead of the curved surface 21 may be used. Alternatively, a configuration in which both the inclined surface and the curved surface 21 are not formed may be used.

In the above examples, a representative configuration has been described in which the upper guiders 30 are provided that come into contact with the upper faces of the side portions 2a of the upper lid 2, the side portions being opposed to each other above the strips 5a, when the container 3 is inserted in the horizontal direction to the specified position P of the placement platforms 10. However, our devices are not limited to this configuration. The upper guiders 30 may be configured to come into contact with a part of an upper face of the upper lid 2 instead of coming into contact with the upper faces of the side portions 2a. Alternatively, the upper guiders 30 do not have to be provided. For example, when the container 3 is heavy, even when the strips 5a are rotated upward by the lower guiders 20, the container 3 (upper lid 2) is not moved upward simultaneously. Thus, in using such a container 3, the upper guiders 30 do not have to be provided.

In the above-described examples, a representative configuration has been described in which the lower guiders 20 and the upper guiders 30 hold the upper lid 2 in a state in which locking by the locking mechanisms 4 has been released. However, our devices are not limited to this configuration. For example, a configuration in which the upper lid 2 is held and raised by another holder while the locking by locking mechanisms 4 is released by the lower guiders 20 and the upper guiders 30 may be used.

One or more requirements described in the above configuration, for example, may be omitted. Requirements described in the above configuration, for example, may be combined appropriately. Japanese Patent Application No. 2019-030400 that is a Japanese patent application and all literatures cited in the above configuration, for example, may be used as a part of the description in this disclosure.

The invention claimed is:

1. A lid opening-and-closing device that opens and closes an upper lid of a container, the container comprising: a container body; the upper lid; a locking mechanism that locks the upper lid onto the container body when the upper lid is mounted on the container body; and a strip provided to the upper lid, extends in a horizontal direction, and releases locking by the locking mechanism when being rotated upward to an extent exceeding a predetermined value with respect to the container body, the lid opening-and-closing device comprising:
    a placement platform on which the container is placed;
    a guide provided on both sides above the placement platform and comes into contact with a lower face of the strip to rotate the strip upward to an extent exceeding the predetermined value with respect to the container body during a process of inserting the container is inserted in the horizontal direction to a specified position of the placement platform; and
    a raising/lowering mechanism that moves the container body and the upper lid for which locking by the locking mechanism has been released, relatively in an up-and-down direction.

2. The lid opening-and-closing device according to claim 1, comprising an upper guide that comes into contact with an upper face of each of side portions of the upper lid, the side portions being opposed to each other above the strip, when the container is inserted in the horizontal direction to the specified position of the placement platform.

3. The lid opening-and-closing device according to claim 2, wherein
    a groove is formed by an upper face of the guide and a lower face of the upper guide, and
    the side portions of the upper lid and the strip are movable along the groove.

4. The lid opening-and-closing device according to claim 3, wherein the groove is provided in the raising/lowering mechanism.

5. The lid opening-and-closing device according to claim 4, wherein
    the groove holds the side portions of the upper lid and the strip, and
    the raising/lowering mechanism includes a raising/lowering driver that raises and lowers the guide and the upper guide held by the groove with respect to the container body.

6. The lid opening-and-closing device according to claim 1, wherein, on a tip of the placement platform on an inlet side for insertion of the container, a slope is provided.

7. The lid opening-and-closing device according to claim 1, wherein, on a tip of the guide on an inlet side, an inclined surface or a curved surface is provided.

\* \* \* \* \*